United States Patent [19]
Wada et al.

[11] Patent Number: 5,390,345
[45] Date of Patent: Feb. 14, 1995

[54] METHOD FOR PREVENTING DESENSITIZATION AND RADIO INTERFERENCE OF RADIO RECEIVERS

[75] Inventors: Masahiro Wada, Tokyo; Kazuo Tominaga, Kanagawa, both of Japan

[73] Assignees: Nippon Telegraph and Telephone Corporation; Toyo Communication Equipment Co., Ltd., both of Japan

[21] Appl. No.: 829,034
[22] PCT Filed: May 31, 1991
[86] PCT No.: PCT/JP91/00731
§ 371 Date: Mar. 30, 1992
§ 102(e) Date: Mar. 30, 1992
[87] PCT Pub. No.: WO91/19356
PCT Pub. Date: Dec. 12, 1991

[30] Foreign Application Priority Data

Jun. 1, 1990 [JP] Japan .................................. 2-144107

[51] Int. Cl.$^6$ ............................................. H04B 1/10
[52] U.S. Cl. ................ 455/234.1; 455/249.1; 455/254; 455/295; 455/296
[58] Field of Search ........... 455/234.1, 239.1, 245.1, 455/249.1, 250.1, 254, 295, 296, 308, 311

[56] References Cited
U.S. PATENT DOCUMENTS 4,355,414 10/1982 Inoue .................................. 455/250.1
4,792,992 12/1988 Rinderle ........................... 455/249.1

FOREIGN PATENT DOCUMENTS

| | | | |
|---|---|---|---|
| 59-212038 | 11/1984 | Japan ................... | 455/249.1 |
| 0171239 | 8/1986 | Japan ................... | 455/234.1 |
| 0125715 | 6/1987 | Japan ................... | 455/295 |
| 328114 | 12/1987 | Japan . | |
| 202019 | 8/1988 | Japan . | |
| 0170121 | 7/1989 | Japan ................... | 455/296 |

*Primary Examiner*—Curtis Kuntz
*Assistant Examiner*—Chi Pham
*Attorney, Agent, or Firm*—Graham & James

[57] ABSTRACT

A signal which results from cross modulation of two or more nearby received waves contained in the output of a high-frequency amplifier or mixer of a radio receiver, for example, a low-frequency signal corresponding to a channel separation frequency is extracted. The gain of the high-frequency amplifier or attenuation of a variable attenuator provided in the preceding stage of the amplifier is controlled in accordance with the level of the low-frequency signal. Alternatively, the gain of the high-frequency amplifier or attenuation of the variable attenuator is controlled in accordance with the level of the low-frequency signal when it is equal to or larger than a predetermined value. This permits normal reception of a desired wave, even if the signal receiving level is high.

3 Claims, 3 Drawing Sheets

Disturbing wave-sensitivity characteristic

METHOD FOR PREVENTING DESENSITIZATION AND RADIO INTERFERENCE OF RADIO RECEIVERS

TECHNICAL FIELD

The present invention relates to a method for preventing desensitization or radio interference of radio receivers and, more particularly, to a method for preventing a decrease in the receiving sensitivity by high-level reception of both of a desired wave and a near-by disturbing wave, or for preventing interference with the receiving channel by a mixed component of a plurality of near-by disturbing waves without containing a desired wave.

BACKGROUND ART

Important functions of the radio receiver are such as near-by channel selectivity for eliminating near-by channels to demodulate only a desired wave, a function of preventing the radio receiver from operating as if a desired wave is received as a result of the generation of the same frequency component as that of desired wave by mixing of a plurality of disturbing waves, and a function of preventing interference by receiving channels of the same frequency with each other.

These functions are influenced by characteristics of various filters of a receiving high-frequency circuit and an intermediate-frequency amplifying circuit and the nonlinearity of respective circuits, and the degree of interference or disturbance differs with the correlation of receiving frequencies and the received signal level.

To make these functions satisfactory for practical use, efforts have been concentrated on the improvement of characteristics at the device level, such as enhancement of the linearity of the receiving high-frequency circuit and the intermediate-frequency amplifying circuit or maximization of the steepness of the filter characteristic at each stage.

Radio receivers, however, even if made sure to have such required functions through conventional measurement, are not always capable of good reception under the recent radio wave environment.

According to a prior art method for measuring the near-by channel selectivity of the radio receiver, the signal level of a near-by channel is raised in a state in which a signal is received at a level higher than a desired wave receiving sensitivity level of the receiving channel (that is, a state in which a desired wave whose SN ratio is, for example, 6 dB higher than a desired wave signal of a 20 dB is applied to the receiver) and a difference between the signal level of the nearby channel and the desired wave receiving level of the receiving channel is obtained when the above-said SN ratio drops by a predetermined value, and the value thus obtained is regarded as an indication of the near-by channel selectivity of the receiver.

Similar measurements may sometimes be made wherein two nearby waves or two waves bearing a predetermined frequency relationship are applied, as disturbing waves, to the receiver at the same level.

At any rate, conventional measurements of receiver functions all utilize the desired wave signal of the sensitivity level at the basis of measurement, as typified by the above method; hence, the absolute value of the level of the disturbing wave is inevitably very low in the evaluation of the functions.

However, there are cases where radio receivers, even if found by the above-mentioned measurement to possess the prescribed functions, are incapable of normal reception of signals of extremely high levels, even if the level difference between the desired wave and the disturbing wave is less than a prescribed value.

For example, in the vicinity of a base station where a multifrequency transmitting antenna is provided, the desired wave and the disturbing wave are both received at an extremely high level, but even if the disturbing wave is slightly higher in level than the desired wave, that is, even if the level difference between them is only 10 dB or so, the level of the desired wave in the receiver is suppressed owing to the nonlinearity of the receiving high-frequency circuit—this markedly decreases the receiving sensitivity, hindering the normal reception.

Under such conditions, not only the near-by channel selectivity but also the interference eliminating function are impaired; for example, frequency components nearby the desired wave receiving channel, which are generated by harmonic waves of two or more disturbing waves present anywhere in the same receiving frequency band or a mixture thereof, cause interference and hence pose the same problem as mentioned above.

Such a problem is encountered more frequently with the recent increase in the numbers of radio channels and base stations or repeater stations; namely, radio service zones are formed everywhere in the center of a city, in particular, where many radio stations are established—this constitutes a serious obstacle to mobile communications.

DISCLOSURE OF THE INVENTION

It is therefore an object of the present invention to provide a method for preventing desensitization and radio interference of radio receivers to permit normal reception even if radio waves are received at high levels.

To attain the above objective, according to the present invention, a signal, which results from cross modulation of two or more near-by received waves contained in the high-frequency amplifier output or mixer output of the radio receiver, for example, a low-frequency signal corresponding to a channel separation frequency, is extracted, and the gain of the high-frequency amplifier or attenuation of a variable attenuator provided in the preceding stage of the high-frequency amplifier is controlled in accordance with the level of the extracted signal when it is higher than a predetermined value.

BEST MODE FOR CARRYING OUT THE INVENTION

The present invention will hereinafter be described in detail with reference to the accompanying drawings.

Figure 1:
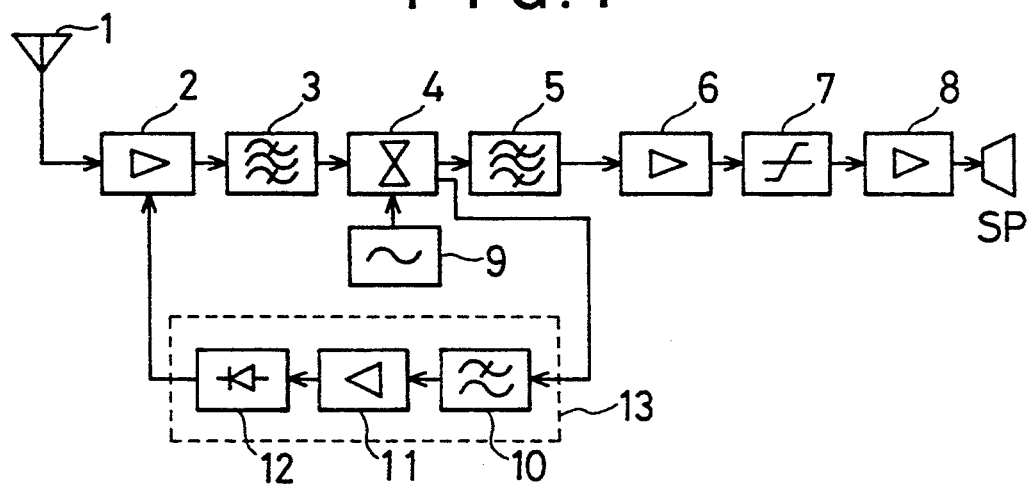
FIG. 1 is a block diagram illustrating an example of a radio receiver embodying the present invention.

FIG. 1 illustrates in block form an example of an FM receiver embodying the present invention.

In FIG. 1, reference numeral 1 indicates an antenna, which is connected to a receiving circuit which is made up of a cascade connection of a variable gain type high-frequency amplifier 2, a high-frequency filter 3, a mixer 4, an intermediate-frequency filter 5, an intermediate-frequency amplifier 6, a demodulator 7 and a low-frequency amplifier 8 and a local oscillator 9 connected to the mixer 4. In this embodiment the output of the mixer 4 is applied to an interference detector 13 which includes a low-pass filter 10 having a cut-off frequency of, for example 50 kHz or so, a cross-modulated signal amplifier 11 and a rectifier 12, and a DC signal obtained with the rectifier 12 is fed back to a gain control terminal of the above-mentioned variable gain high-frequency amplifier 2.

With such a circuit arrangement, the operation of the receiver portion composed of the antenna 1, the high-frequency amplifier 2, the band-pass filter 3, the mixer 4, the intermediate-frequency filter 5, the intermediate-frequency amplifier 6, the demodulator 7, the low-frequency amplifier 8 and the local oscillator 9 is the same as in the prior art, and hence no detailed description will be given of the operation, but the receiver of this embodiment differs from the conventional receivers in that the gain of the high-frequency amplifier 2 is variable with the above-noted DC signal.

Further, the interference detector 13 in this example detects the presence of disturbing waves of high levels and controls the gain of the high-frequency amplifier 2 as described below.

Figure 2A:
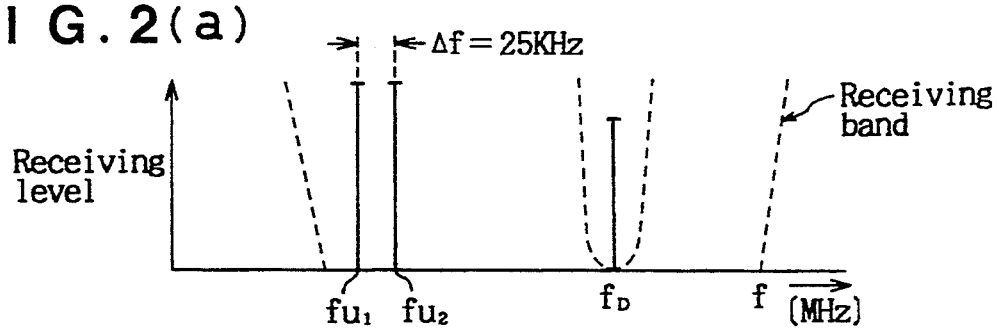
FIGS. 2a, b and c are spectrum diagrams for explaining the operation of the embodiment of the present invention.

FIGS. 2a, b and c are spectrum diagrams for explaining the operation of the interference detector 13.

Figure 2B:
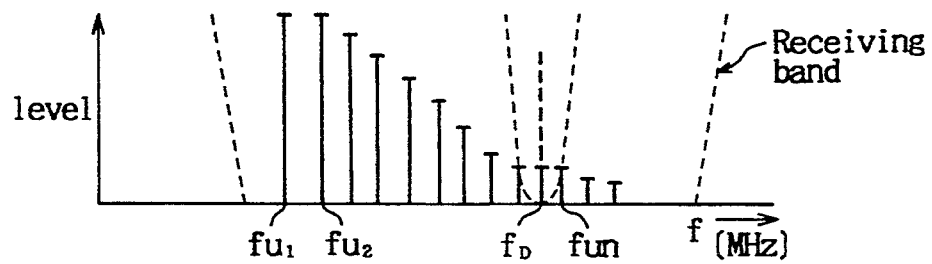

Now, let it be assumed that two disturbing waves $f_{U1}$ and $f_{U2}$ spaced, for example, 25 kHz (which is a channel separation) apart are received at a higher level than a desired wave $f_D$ in the same receiving band, as shown in FIG. 2a. In the prior art harmonic waves are generated owing to the nonlinearity of the receiving high-frequency amplifier 2 or mixer 4 in such an instance, and as shown in FIG. 2b, the level of the desired wave $f_D$ is drastically reduced, while at the same time disturbing signal components $f_{Un}$ are generated in or near the desired wave receiving channel—this leads to interference or serious deterioration of the SN ratio, hampering normal reception of the desired wave $f_D$.

Figure 2C:
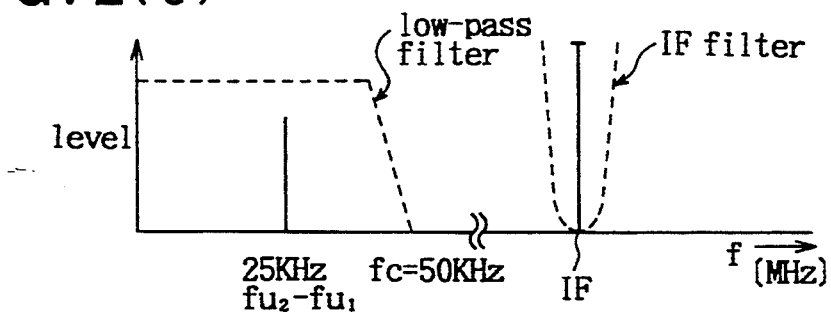

In this case, the output of the mixer 4 contains the difference frequency 25 kHz between the two disturbing waves and a signal component equal to an integral multiple of the difference frequency as depicted in FIG. 2c.

In this embodiment the above-mentioned phenomenon is noted. A low-frequency signal contained in the output of the mixer 4, i.e. a portion of a cross-modulated component, is extracted by the low-pass filter 10 which has a cut-off frequency of, for example, 50 kHz, and it is amplified by the low-frequency amplifier 11 to a required level, thereafter being converted by the rectifier 12 to a DC signal. The gain of the high-frequency amplifier 2 is controlled in accordance with the level of the DC signal. According to the method described above, since no frequency component is extracted by the low-pass filter 10 in case two or more disturbing waves do not exist in the receiving band, the gain of the high-frequency amplifier 2 is not reduced at all but becomes maximum. On the other hand, when a disturbing wave is present as mentioned above, the gain of the high-frequency amplifier 2 is decreased in accordance with the level of the disturbing wave.. Consequently, the degree of distortion in the amplifier 2 substantially lowers and the degree of reduction of the level of the desired wave also decreases or the generation of a disturbing signal component which gets mixed into the intermediate-frequency band is prevented, thus, normal reception of the desired wave is possible.

In other words, the method described above is an attenuation method in which a variable attenuator is provided between the antenna 1 and the high-frequency amplifier 2, and the variable attenuator reduces the signal to the high-frequency amplifier when a level of two or more disturbing waves are very high. In the present invention the operation therefor is automatically performed by extracting the low-frequency signal that results from two or more disturbing waves.

No simple-structured means has been proposed so far for directly extracting the two or more high-frequency disturbing wave which cause cross modulation in the desired wave receiving frequency band, and conventionally it would be necessary therefor to employ a complicated and expensive device which is provided with receivers corresponding to disturbing wave frequencies and rectify amplified intermediated frequencies, just like what is called a frequency selective amplifier.

In contrast thereto, according to the above-described method of the present invention, the presence of disturbing waves can be detected with much ease by extracting a signal which results from inevitable mixing of two or more disturbing waves and the desired wave. In addition, the above signal is a low-frequency signal of about the afore-mentioned channel separation frequency, and hence is easy of selection and amplification. Hence, the method of the present invention can be implemented at low cost.

Figure 3:
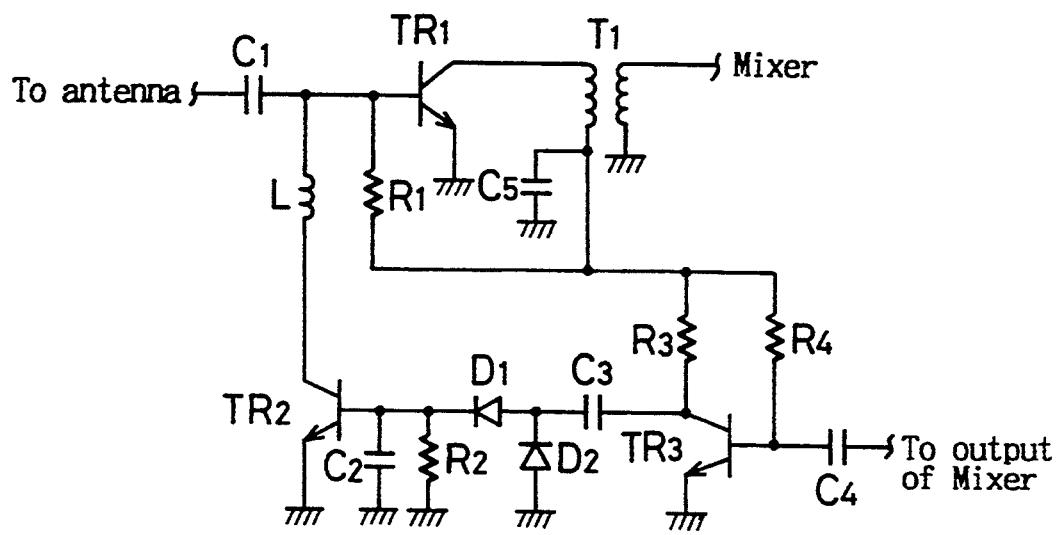
FIG. 3 is circuit diagram showing an example of a receiving high-frequency amplifier for use in the present invention.

FIG. 3 is a circuit diagram illustrating principal parts of a specific operative example of the variable gain type high-frequency amplifier 2.

In FIG. 3, reference character $TR_1$ denotes a common-emitter type high-frequency amplifying transistor, which is supplied at its collector with power via a primary coil of a tuning transformer $T_1$. A bias current supply resistor $R_1$ is connected between the base of the transistor $TR_1$ and a power supply line and the collector of a second transistor $TR_1$ is connected between the base and the ground via a choke coil L. The transistor $TR_1$ has its emitter grounded. A received signal from the antenna is applied via a DC blocking capacitor $C_1$ to the base of the transistor $TR_1$.

A capacitor $C_2$ and a resistor $R_2$ are connected in parallel between the base of the second transistor $TR_2$ and the ground, and the base of the transistor $TR_2$ is connected to the collector of a third transistor $TR_3$ via rectifying diodes $D_1$ and $D_2$ and a capacitor $C_3$.

The collector and the base of the third transistor $TR_3$ are supplied with the power source voltage via resistors $R_3$ and $R_4$, respectively, and a cross-modulated signal based on the above-said disturbing waves, derived by the low-pass filter 10 from the mixer 4, is applied via a capacitor $C_4$ to the base of the transistor $TR_3$. The transistor TR₃ is used as a low-frequency amplifier for amplifying the above-mentioned cross-modulated signal.

With such a circuit arrangement, the collector-emitter resistance of the transistor TR₂ varies with the level of the signal input to the base of the transistor TR₃, accordingly the base bias of the transistor TR₁ of the high-frequency amplifier 2 varies, permitting control of its gain. In this sense the second transistor TR₂ serves as a grounding side bias resistor of the transistor TR₁.

The above-mentioned choke coil L is to block a high-frequency signal but need not always be provided when the collector-emitter impedance of the second transistor TR₂ is high.

With this method, it is considered that a decrease in the base current of the high-frequency amplifier 2 causes a decrease of its dynamic range, resulting in increased signal distortion. It is therefore effective in increasing or decreasing only the high-frequency signal without changing the base bias of the amplifier 2 to insert a capacitor between the collector of the transistor TR₂ and the base of the transistor TR₁ for isolating them DC-wise.

With such an arrangement, it is possible to attenuate only the input signal to the transistor TR₁ without changing its base bias and hence obviate the above-mentioned defect.

Figure 4:
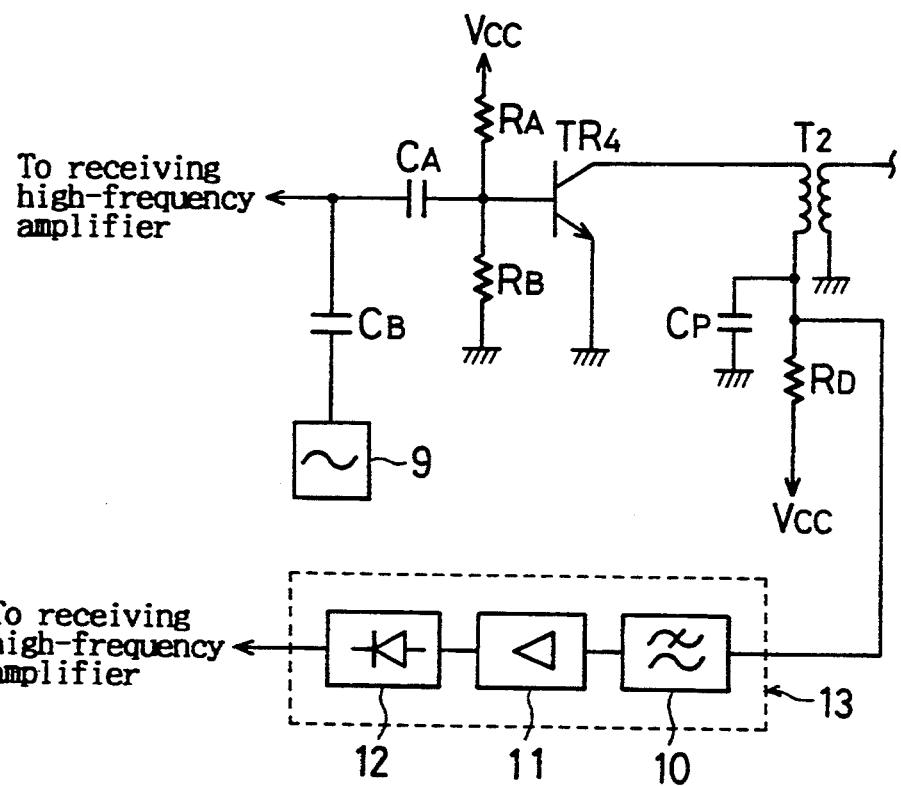
FIG. 4 is a circuit diagram showing an example of cross-modulated signal extracting means.

FIG. 4 illustrates an example of the circuit connection for extracting the afore-mentioned mixed frequency signal from the mixer output, that is, for extracting from the normal intermediate-frequency signal component a low-frequency signal component resulting from distortion of the disturbing waves. Conventionally, in many cases a decoupling resistor R$_D$ is connected in series to the primary coil of a tuning transformer T₂ of the mixer output portion and a by-pass capacitor C$_P$ for grounding the hot side of the resistor R$_D$ high-frequency-wise is also connected to the primary coil, and only the low-frequency signal voltage by the disturbing waves appears in the mixer output portion. Accordingly, such a connection as shown in FIG. 4 allows ease in extracting the cross-modulated signal for use in the present invention.

In this instance, the afore-mentioned low-pass filter 10 need not always be provided if the intermediate-frequency signal, the received high-frequency signal, a local oscillation signal and their mixed output are sufficiently removed by this method to extract only the low-frequency signal based on the disturbing waves.

Figure 5:
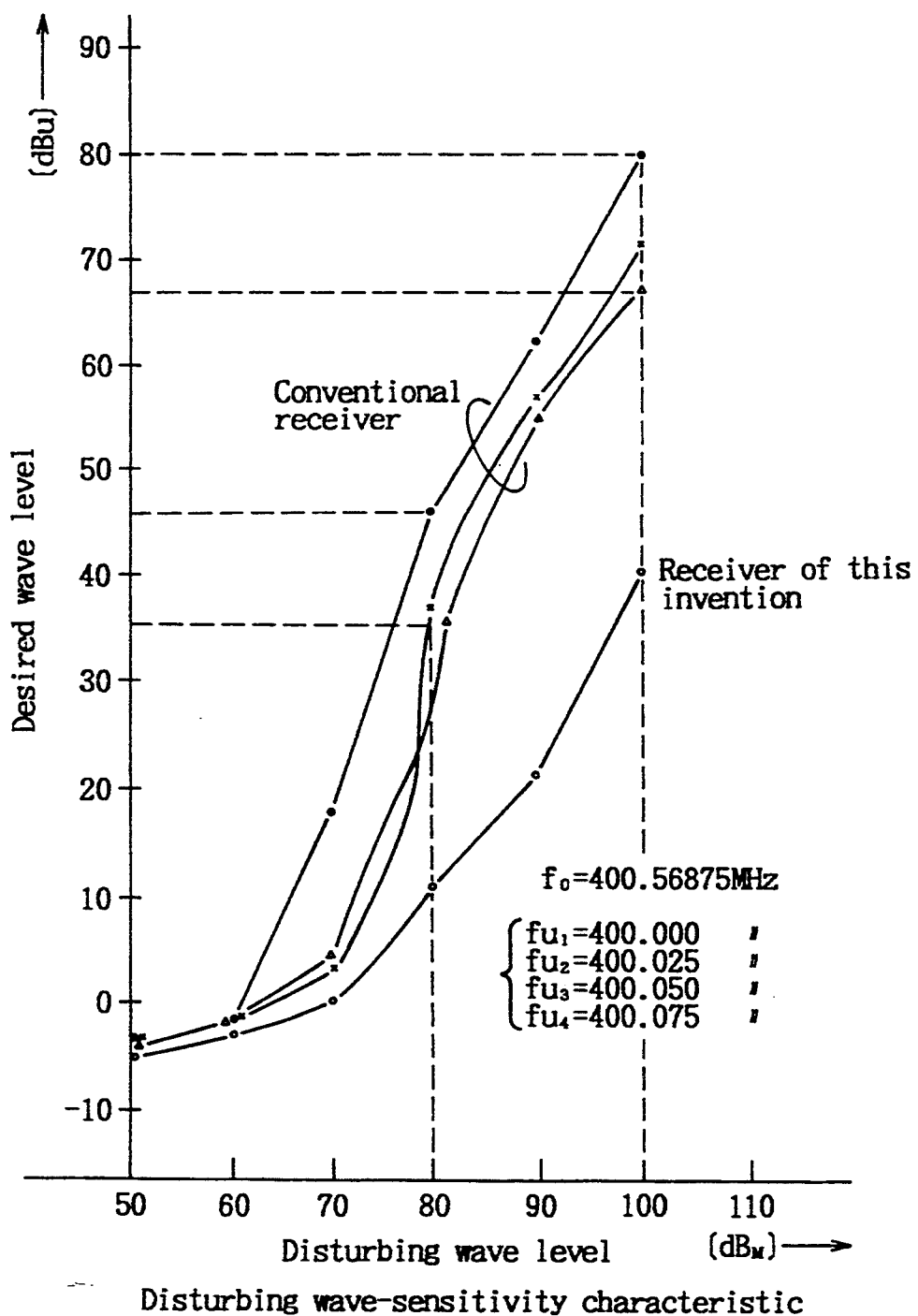
FIG. 5 is a graph showing a desensitization characteristic of the receiver according to the present invention, for evaluation of its performance, together with similar characteristics of conventional receivers.

FIG. 5 is a graph showing measured results of the performance of a receiver embodying the present invention. For better understanding of the effect of the invention, results of performance tests of conventional receivers are also shown.

In the performance test the desired wave f$_D$ of 400.56875 MHz and four disturbing wave signals f$_{U1}$ through f$_{U4}$ which are 493.75 kHz lower than the desired wave f$_D$ (the disturbing wave signals being sequentially spaced 25 kHz apart) are simultaneously applied to the high-frequency input end of the receiver via a required coupling circuit. In FIG. 5, the abscissa represents the disturbing wave level (all the levels of the disturbing wave signals being the same) and the ordinate represents the level of the desired wave signal corresponding to a predetermined SN ratio (20 dB, for instance) reached when the respective disturbing wave signals were input.

In the measurements the frequency of the desired wave signal was 400.56875 MHz as mentioned above and frequencies of the four disturbing wave signals were 400.000, 400.025, 400.050 and 400.075 MHz, and three conventional receivers fabricated on the basis of different designs were employed.

As is evident from FIG. 5, in the conventional receivers the desired wave receiving sensitivity stays at a predetermined value of about −5 dBμ until the disturbing wave level reaches approximately 60 dBμ, but as the disturbing wave level further increases, the desired wave receiving sensitivity rapidly deteriorates, and when the disturbing wave level is 100 dBμ, the desired wave signal cannot normally be received unless its level is in the range of 65 to 80 dBμ.

This means that the desired wave signal cannot be received or the SN ratio is seriously impaired when the level of the disturbing wave signal goes very high, for example, when the level is only 20 to 35 dB or so higher than the level of the desired wave.

On the other hand, the receiver according to the present invention is able to receive the desired wave at a level of 45 dBμ even when the level of the disturbing wave is as high as 100 dBμ, and the level of the desired wave receivable by the receiver is about 10 dBμ when the disturbing wave is at an intermediate level, for instance, 80 dBμ, whereas in the conventional receivers the level of the desired wave needs to be in the range of between 35 and 45 dBμ in such a case. The difference of 25 to 35 dBμ is the difference in sensitivity between the receiver according to the present invention and conventional receivers. This demonstrates that the effect of improvement by the present invention is very marked.

In the above-mentioned measurements the channel separation of the receiving frequency band is 25 kHz and the cut-off frequency of the low-pass filter 10 for extracting the cross-modulated signal must be set to a value equal to or higher than at least 25 kHz but lover than the intermediate frequency; however, when the channel separation is 12.5 kHz, the low-pass filter 10 needs only to extract a frequency component of at least 12.5 kHz.

Although the above embodiment has been described to derive the cross-modulated signal from the mixer 4, it is evident that the invention is not limited specifically thereto but that the signal can also be derived from, for example, the output of the high-frequency amplifier or similar element.

The variable gain type high-frequency amplifier 2 need not be limited specifically to that exemplified in FIG. 3 but may also be modified into various forms.

While in the above embodiment the gain of the high-frequency amplifier 2 is increased or decreased by controlling the base bias of the transistor TR₁ forming the amplifier 2, it is also possible to connect a variable attenuator between the antenna 1 and the high-frequency amplifier 2 and control its attenuation. When the attenuator is excellent in linearity, the characteristic shown in FIG. 5 can be further improved.

That is, in the above embodiment the linearity of the high-frequency amplifier 2 is likely to deteriorate, because its gain is reduced by decreasing the base bias current of the transistor TR₁, but the use of an attenuator of excellent linearity affords reduction of the level of the signal input to the high-frequency amplifier 2 without degrading its characteristic; hence, the desired wave receiving level selecting characteristic can be maintained theoretically within the attenuation variable range of the attenuator.

For example, in the case where the desired wave receiving level selecting characteristic is 80 dBµ, the desired wave can be received when its level is 20 dBµ, even if the level of the disturbing wave is 100 dBµ.

As the variable attenuator of excellent linearity for use in the present invention, it is possible to employ a variable attenuator for high-frequency signal use which has an arrangement in which its attenuation is controlled by electrically switching, from the outside, electronic switches connected to a plurality of terminals of a resistance network or ladder-type resistance network.

If such a variable attenuator is allowed to be somewhat nonlinear, then the attenuator can be implemented by voltage or current control of a transistor, FER, diode, or similar semiconductor device.

For controlling the variable gain type high-frequency amplifier or variable attenuator a comparator or logarithmic amplifier may also be employed in the aforementioned interference detecting portion, by which the gain of the amplifier or attenuation of the attenuator are controlled for only disturbing waves of levels above a certain value, or the gain is reduced or attenuation is varied greatly as the disturbing wave level increases.

In recent years there has been studied, for a novel receiving system, a practical application of a method in which a received signal and a local oscillation signal of the same frequency are mixed together and the mixed signal is used to directly demodulate a signal superimposed on a carrier. It will be appreciated that the present invention is also applicable to such a method.

As described above, according to the present invention, it is possible to prevent, by a simple method, radio interference or desensitization of a radio receiver which occurs when two or more disturbing signal levels are high. Thus, the present invention produces a remarkable effect in improving the functions and performance of radio receivers.

We claim:

1. A radio receiver capable of preventing radio interference caused by cross modulation of two or more disturbing waves, comprising:

a high-frequency amplifier for amplifying a received signal, a gain of said high-frequency amplifier being controlled by a direct current signal;

a local oscillator;

a mixer for outputting an intermediate frequency signal caused by mixing an output signal of said local oscillator and an output signal of said high-frequency amplifier; and interference detector means for detecting a cross modulated product within said intermediate frequency signal, comprising a filter which separates said cross modulated product from said intermediate frequency signal, said cross modulated product having a low frequency which is at least equal to the channel separation frequency of said two or more disturbing waves, and a rectifier for generating said direct current signal from said cross modulated product for controlling said gain of said high-frequency amplifier.

2. A radio receiver capable of preventing radio interference caused by cross modulation of two or more disturbing waves, comprising:

an attenuator which controls an attenuation level of a signal by application of a direct current signal;

a high-frequency amplifier for amplifying an output signal of said attenuator;

a local oscillator;

a mixer for outputting an intermediate frequency signal generated by mixing an .output signal of said local oscillator and an output signal of said high-frequency amplifier;

interference detector means for detecting a cross modulated product within said intermediate frequency signal, comprising a filter which separates said cross modulated product from said intermediate frequency signal, said cross modulated product having a low frequency which is at least equal to the channel separation frequency of said two or more disturbing waves, and a rectifier for generating said direct current signal from said cross modulated product for controlling said attenuation level.

3. A radio receiver according to claim 1, wherein:

said high-frequency amplifier is comprised of at least two transistors, a base of the first transistor receiving a signal from an antenna of said radio receiver, said base being connected to a capacitor, said base of said first transistor also being connected to a ground via a choke coil and a collector and an emitter of the second transistor, said choke coil being capable of obstructing passage of high-frequency signals, a collector of said first transistor being connected to a power supply via a primary coil of a tuning transformer, a base of said second transistor being connected to a rectifier, said rectifier being connected to said interference detector means to receive said direct current signal.

* * * * *